US010661566B2

United States Patent
Fukumoto et al.

(10) Patent No.: US 10,661,566 B2
(45) Date of Patent: May 26, 2020

(54) BONDED SUBSTRATE BODY, METHOD FOR MANUFACTURING BONDED SUBSTRATE BODY, LIQUID DISCHARGE HEAD, AND METHOD FOR MANUFACTURING LIQUID DISCHARGE HEAD

(71) Applicant: CANON KABUSHIKI KAISHA, Tokyo (JP)

(72) Inventors: Yoshiyuki Fukumoto, Kawasaki (JP); Atsunori Terasaki, Kawasaki (JP); Ryoji Kanri, Zushi (JP); Atsushi Hiramoto, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/937,580

(22) Filed: Mar. 27, 2018

(65) Prior Publication Data
US 2018/0281414 A1 Oct. 4, 2018

(30) Foreign Application Priority Data
Mar. 30, 2017 (JP) .................... 2017-069287

(51) Int. Cl.
*B41J 2/16* (2006.01)
*B81C 3/00* (2006.01)
(Continued)

(52) U.S. Cl.
CPC ............. *B41J 2/1623* (2013.01); *B41J 2/045* (2013.01); *B41J 2/1603* (2013.01); *B41J 2/1606* (2013.01); *B41J 2/1628* (2013.01); *B41J 2/1629* (2013.01); *B41J 2/1631* (2013.01); *B41J 2/1632* (2013.01); *B41J 2/1634* (2013.01); *B41J 2/1642* (2013.01); *B41J 2/1645* (2013.01); *B41J 2/1646* (2013.01); *B81B 1/004* (2013.01); *B81B 3/0072* (2013.01);
(Continued)

(58) Field of Classification Search
CPC .............. B41J 2/16–1646; B41J 2/1623; B41J 2/1629; B41J 2/1603; B41J 2/1631; B41J 2/1632; B41J 2/1645; B41J 2/1606; B41J 2/1634; B41J 2/1646; B41J 2/1628; B41J 2/1642; B41J 2/045; B41J 2202/22; B81C 1/00809; B81C 1/00666; B81C 3/001; B81C 2201/016; B81C 2203/032; B81B 3/0072; B81B 1/004; B81B 2201/052; C23C 16/45525; C23C 16/405
See application file for complete search history.

(56) References Cited

U.S. PATENT DOCUMENTS

2008/0055362 A1* 3/2008 Irinoda ................ B41J 2/14274
347/51
2009/0147051 A1* 6/2009 Yamamoto ........... B41J 2/14274
347/47
(Continued)

FOREIGN PATENT DOCUMENTS

JP 2014-124887 A 7/2014

*Primary Examiner* — Scott A Richmond
(74) *Attorney, Agent, or Firm* — Canon U.S.A. Inc., IP Division

(57) ABSTRACT

A method for manufacturing a bonded substrate body in which an end portion of an adhesive is located at a position retreated in a direction to the inside of the bonded substrate body from an end surface of a bonding region of a first substrate and a second substrate includes forming a film on the end portion of the adhesive.

20 Claims, 11 Drawing Sheets

(51) Int. Cl.
*B81C 1/00* (2006.01)
*B81B 1/00* (2006.01)
*B81B 3/00* (2006.01)
*B41J 2/045* (2006.01)
*C23C 16/455* (2006.01)
*C23C 16/40* (2006.01)

(52) U.S. Cl.
CPC ...... *B81C 1/00666* (2013.01); *B81C 1/00809* (2013.01); *B81C 3/001* (2013.01); *B41J 2202/22* (2013.01); *B81B 2201/052* (2013.01); *B81C 2201/016* (2013.01); *B81C 2203/032* (2013.01); *C23C 16/405* (2013.01); *C23C 16/45525* (2013.01)

(56) References Cited

U.S. PATENT DOCUMENTS

2009/0293277 A1* 12/2009 Uchiyama ................ B41J 2/161
                29/890.1
2015/0266296 A1* 9/2015 Mizukami ............ B41J 2/14201
                347/68

* cited by examiner

113

115  141

124

BONDED SUBSTRATE BODY, METHOD FOR MANUFACTURING BONDED SUBSTRATE BODY, LIQUID DISCHARGE HEAD, AND METHOD FOR MANUFACTURING LIQUID DISCHARGE HEAD

BACKGROUND OF THE INVENTION

Field of the Invention

The present disclosure relates to a bonded substrate body in which a plurality of substrates is bonded through an adhesive, a method for manufacturing the same, a liquid discharge head using the bonded substrate body, and a method for manufacturing the same.

Description of the Related Art

In recent years, in manufacturing of functional devices, such as MEMS (Micro Electro Mechanical System), such as a pressure sensor and an accelerometer, and a microfluid device, a device containing a bonded substrate body in which substrates are bonded through an adhesive is produced. As an example thereof, a liquid discharge head discharging liquid is mentioned.

As an example of the liquid discharge head, an ink jet recording head is mentioned. The ink jet recording head has an energy generating element giving energy for discharging ink. Moreover, a discharge port formation member is formed on the front surface of the substrate and a plurality of discharge ports discharging ink is opened in the discharge port formation member. Moreover, a through-hole as an ink flow passage is formed in the substrate, and ink is supplied from the rear surface side of the substrate towards the front surface side thereof passing through the through-hole. The through-hole and the discharge port communicate with each other and the ink passing through the through-hole is discharged from the discharge port by the force given from the energy generating element. Examples of the energy generating element include elements capable of boiling ink by electrical heating, such as a heater element, and elements capable of applying pressure to liquid utilizing volume changes, such as a piezoelectric element.

In the ink jet recording head, the inner wall surface of the ink flow passage is subject to erosion by ink. When exposed to ink for a long period of time, the flow passage structure sometimes collapses. In particular, when a substrate is a silicon substrate, such damage caused by ink is likely to occur. When the ink flow passage is formed by bonding substrates processed into a flow passage shape through an adhesive, ink enters the adhesion boundary, so that the adhesive strength between the substrates decreases in some cases.

As a technique of reducing the damage caused by ink to the substrates and the adhesive, a technique of protecting the surface of the bonded substrate body by a protective film (liquid resistant film) which is hardly affected by ink has been proposed (Japanese Patent Laid-Open No. 2014-124887). FIG. 1 is a view explaining a surface protection method of a bonded substrate body described in Japanese Patent Laid-Open No. 2014-124887. In a bonded substrate body 150 illustrated in FIG. 1A, a first substrate 151 and a second substrate 152 are bonded through an adhesive 153. The bonded substrate body 150 has an ink flow passage 154 provided over the first substrate 151 and the second substrate 152 and a discharge port discharging ink is formed in the first substrate 151. On the inner wall surface of the ink flow passage 154, a protective film 157 containing at least one kind of material selected from the group consisting of tantalum oxide, hafnium oxide, and zirconium oxide formed by atomic layer deposition is provided from the inner wall surface to the top of the adhesive 153. Japanese Patent Laid-Open No. 2014-124887 describes that the substrates and the adhesive can be prevented from being eroded by ink by taking such a configuration.

SUMMARY OF THE INVENTION

A method for manufacturing a bonded substrate body of the present disclosure is a method for manufacturing a bonded substrate body in which a first substrate and a second substrate are bonded through an adhesive and which has a film formed on the bonded substrate body over the first substrate, the second substrate, and a bonding region of the first substrate and the second substrate, and the method includes forming the film to the bonding region in which an end portion of the adhesive is located at a position retreated in a direction to the inside of the bonded substrate body from an end surface of the bonding region.

A liquid discharge head of the present disclosure has a discharge port discharging liquid and an element generating energy utilized for discharging the liquid, in which the liquid discharge head has a bonded substrate body in which a first substrate and a second substrate are bonded through an adhesive, which has a film formed on the bonded substrate body over the first substrate, the second substrate, and a bonding region of the first substrate and the second substrate, and in which an end portion of the adhesive is located at a position retreated in a direction to the inside of the bonded substrate body from a surface on which the film is formed, the bonded substrate body has a flow passage of the liquid contacting the first substrate and the second substrate, and the film is formed on the inner wall surface of the flow passage over the first substrate, the second substrate, and the bonding region of the first substrate and the second substrate.

Further features of the present disclosure will become apparent from the following description of exemplary embodiments with reference to the attached drawings.

DESCRIPTION OF THE EMBODIMENTS

Figure 1A:
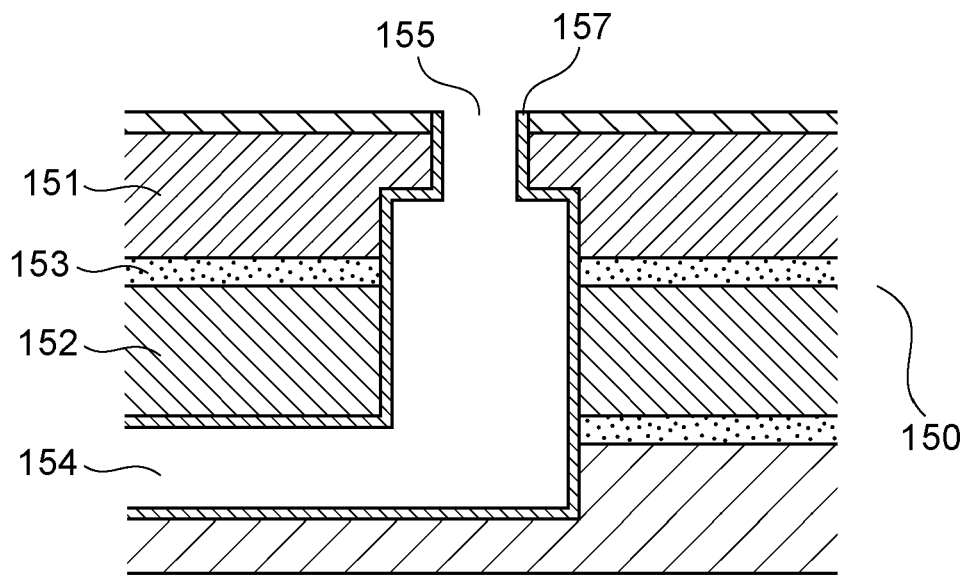
FIGS. 1A and 1B are cross-sectional views illustrating a method for manufacturing a former bonded substrate body.
Figure 1B:
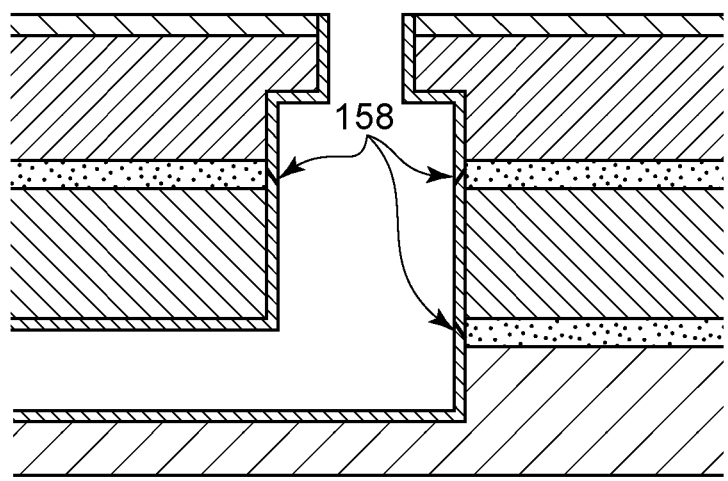

The present inventors have found that, even when an attempt has been made to form a film over an adhesive as in Japanese Patent Laid-Open No. 2014-124887, it has been difficult to form a good film over the top of the adhesive in some cases. This is most likely due to the fact that the adhesive is slightly deformed by temperature changes, pressure changes, or the like to be applied to a bonded substrate body in a manufacturing process, so that stress is applied to a film, and thus cracks 158 as illustrated in FIG. 1B are generated. It is considered that, particularly when the film containing inorganic elements described in Japanese Patent Laid-Open No. 2014-124887 is formed on the adhesive, the film is likely to be damaged due to a large difference in the coefficient of thermal expansion between the film and resin in the adhesive.

It is considered that, when the cracks are generated in the film, ink enters from gaps between the cracks to cause damage in the adhesive, which leads to poor bonding of the substrates. Moreover, it is also considered that the film is peeled to be wastes floating in the flow passage, which affects the discharge performance in some cases.

The present disclosure has been made in view of the above-described disadvantages. It is an aspect of the present disclosure to provide a bonded substrate body in which substrates are bonded through an adhesive, in which a good film is formed over the top of the adhesive and a method for manufacturing the same. It is another aspect of the present disclosure to provide a liquid discharge head having such a bonded substrate body and a method for manufacturing the same.

Hereinafter, a bonded substrate body and a method for manufacturing the same are described taking a liquid discharge head as an example.

First Embodiment

A first embodiment of a liquid discharge head and a method for manufacturing the same is described with reference to the drawings. FIG. 2A to FIG. 2H are views explaining a method for manufacturing a liquid discharge head according to this embodiment step by step and FIG. 2H is a completed view of a liquid discharge head. FIG. 2A to FIG. 2H all illustrate cross-sectional views of the liquid discharge head.

Structure of Liquid Discharge Head

As illustrated in FIG. 2H, the liquid discharge head according to this embodiment has a bonded substrate body 130 in which a first substrate 131 and a second substrate 132 are bonded in the vertical direction through an adhesive 123. On the first substrate 131 configuring the bonded substrate body 130, an energy generating element 107 generating energy utilized for discharging liquid is formed. Moreover, on the first substrate 131, a wiring film for driving the energy generating element 107 and a surface membrane layer 103 containing an interlayer insulation film are formed. On the bonded substrate body 130, a discharge port formation member 119 is formed in which a discharge port 101 discharging liquid is formed. The discharge port formation member 119 contains a top plate 117 in which the discharge port 101 opens and a side wall 118 forming a pressure chamber 102 communicating with the discharge port 101 and giving energy generated from the energy generating element 107 to liquid. The discharge port 101 and the pressure chamber 102 can be regarded as one kind of a liquid flow passage.

In the bonded substrate body 130, a liquid flow passage 115 is provided. On the inner wall surface of the flow passage 115, a film 124 is formed ranging over the first substrate 131 and the second substrate 132. The details of the film are described later. The flow passage 115 contains first flow passages 112 connected to the pressure chamber 102 corresponding to one discharge port 101, second flow passages 113 connected to two or more of the first flow passages 112 in the liquid discharge head and distributing liquid to the flow passages 112, and third flow passages 114 connected to the second flow passages 113. In this embodiment, the first flow passages 112 and the second flow passages 113 of the flow passage 115 are formed in the first substrate 131 and a third flow passage 114a is formed in the second substrate 132.

In the liquid discharge head illustrated in FIG. 2H, two flow passages 115a and 115b are connected to one pressure chamber 102 and liquid in the pressure chamber 102 can be circulated between the inside and the outside of the pressure chamber 102 through the two flow passages 115a and 115b. Specifically, liquid can be made to flow into the pressure chamber 102 through the flow passage 115a on the left side and can be made to flow out of the flow passage 115b on the right side as indicated by the arrow of FIG. 2H. When the liquid discharge head according to this embodiment is applied to an ink jet recording head, for example, ink in the discharge port 101 or the ink of the pressure chamber 102 can be prevented from thickening by the flow of the liquid. With the liquid discharge head having the configuration of circulating liquid as illustrated in FIG. 2H, the width of a portion (portion in which the energy generating element 107 is formed of the bonded substrate body) at the center of the bonded substrate body in FIG. 2H is narrowed, and therefore peeling is likely to occur on the bonding surface of this portion. Therefore, it is important to cover the bonded substrate body with a good film to improve the adhesion reliability between the substrates in the liquid discharge head having such a configuration.

Method for Manufacturing Liquid Discharge Head

1. Process of Preparing First Substrate and Second Substrate

Figure 2A:
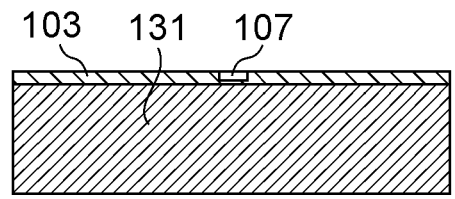
FIGS. 2A to 2H are cross-sectional views illustrating a manufacturing method of a first embodiment.

First, as illustrated in FIG. 2A, the first substrate 131, on the front surface of which the surface membrane layer 103 and the energy generating element 107 are formed by a photolithography process, is prepared. As the first substrate 131, various kinds of substrates suitable for forming the energy generating element 107 and the wiring film are usable. The first substrate 131 suitably contains any one selected from the group consisting of silicon, silicon carbide, silicon nitride, glass (silica glass, borosilicate glass, non-alkali glass, soda glass), alumina, gallium arsenide, gallium nitride, aluminum nitride, and aluminum alloy. Among the above, a silicon substrate is suitably used as the first substrate 131. Examples of the energy generating element 107 include an electrothermal conversion element and a piezoelectric element. The first substrate 131 can be thinned from the rear surface side as necessary. Examples of thinning methods include grinding or wet etching by chemical solutions, such as nitrohydrofluoric acid. The rear surface of the first substrate 131 is suitably smoothened in order to facilitate bonding in a bonding process with the second substrate 132 described later. Examples of smoothing methods include grinding by a grindstone having high coarseness, dry polish, grinding by CMP (Chemical Mechanical Polishing), dry etching by reactive gas, and wet etching by chemical solutions, such as nitrohydrofluoric acid.

Figure 2B:
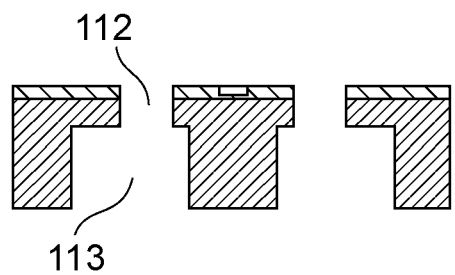

Next, as illustrated in FIG. 2B, the first flow passages 112 and the second flow passages 113 are formed in the first substrate 131. Examples of techniques of forming the flow passages include dry etching, wet etching, laser, and a sandblast method. The second flow passage 113 of a groove shape is formed by digging the first substrate 131 from the rear surface side to the middle of the substrate 131. Furthermore, the first substrate 131 is dug from the front surface side until the first substrate 131 communicates with the second flow passage 113 to form two or more of the flow passages 112 of a hole shape. The shapes of the first flow passage 112 and the second flow passage 113 are not limited to the shapes described above and the optimal shape can be selected according to the need of a device. Moreover, the order of forming the same is not limited and the second flow passage 113 may be formed after forming the first flow passage 112.

Figure 2C:
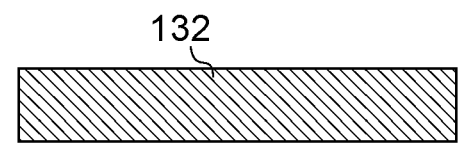

Next, as illustrated in FIG. 2C, the second substrate 132 is prepared. As materials of the second substrate 132, the same materials as those of the first substrate 131 are usable. In particular, as the second substrate, a silicon substrate is suitably used. The second substrate 132 can also be thinned or smoothened in the same manner as the first substrate 131.

Figure 2D:
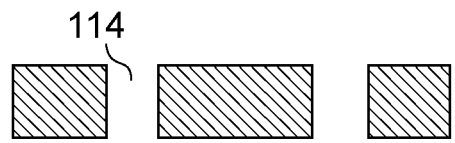

Next, as illustrated in FIG. 2D, the third flow passage 114 is formed as a through-hole in the second substrate 132 by the same technique as that of the first flow passage 112 and the second flow passage 113.

2. Process of Bonding First Substrate and Second Substrate

Figure 2E:
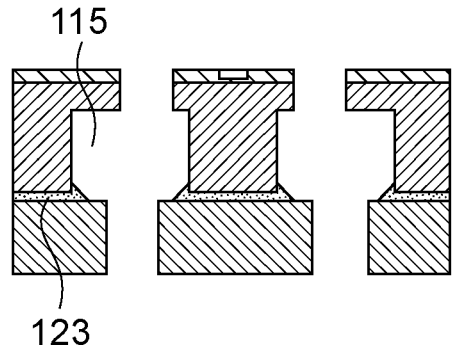

Next, as illustrated in FIG. 2E, the adhesive 123 is applied to the rear surface (bonding surface with the second substrate 132) of the first substrate 131 to bond the first substrate 131 and the second substrate 132 through the adhesive 123. At this time, the first flow passage 112, the second flow passage 113, and the third flow passage 114 communicate with each other to configure the flow passage 115. In this embodiment, the area of the bonding surface of the first substrate 131 is smaller than the area of the bonding surface of the second substrate 132, and therefore the adhesive 123 is suitably applied to the bonding surface side of the first substrate 131 so as not to excessively apply the adhesive 123. The adhesive 123 may be applied to the bonding surface of the second substrate 132.

Figure 3A:
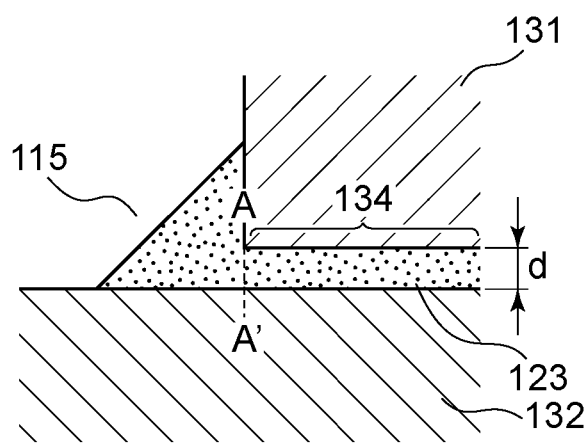
FIGS. 3A to 3E are enlarged cross-sectional views in the manufacturing method of the first embodiment.

FIG. 3A illustrates an enlarged cross-sectional view near the bonding surface in bonding the substrates 131 and 132. In usual, the adhesive 123 flows to protrude to the flow passage 115 side by pressurization to the substrates 131 and 132 when bonded. More specifically, the adhesive 123 protrudes into the flow passage 115 beyond an end surface A-A' of a bonding region 134 of the first substrate 131 and the second substrate 132. The bonding region 134 is a region where the bonding surface of the first substrate 131 and the bonding surface of the second substrate 132 are formed so as to face each other. In an aspect illustrated in FIG. 3A, the inner wall surface on the first substrate 131 side is located at a retreated position relative to the inner wall surface on the second substrate 132 side as viewed from the flow passage 115 side, and therefore the end surface A-A' in the bonding region is also an extension surface of the inner wall surface on the first substrate 131 side.

As the adhesive 123, materials with high adhesiveness to the substrates are suitably used. Moreover, materials with little mixing of air bubbles and the like and with high coatability are suitable and low viscosity materials with which the thickness of the adhesive 123 is easily reduced are suitable. The adhesive 123 suitably contains any resin selected from the group consisting of an epoxy resin, an acrylic resin, a silicone resin, a benzocyclobutene resin, a polyamide resin, a polyimide resin, and a urethane resin. Examples of curing systems of the adhesive 123 include a heat curing system and a UV delayed curing system. When any one of the substrates has UV transmittance, a UV curing system is also usable.

Examples of techniques of applying the adhesive 123 include an adhesive transfer method by a substrate. Specifically, a substrate for transfer is prepared and, then the adhesive 123 is thinly and uniformly applied onto the substrate for transfer by a spin coating method or a slit coating method. Thereafter, the adhesion surface of the first substrate 131 is brought into contact with the applied adhesive 123, whereby the adhesive 123 can be transferred only to the adhesion surface of the first substrate 131. The size of the substrate for transfer is suitably equal to or larger than the dimension of the first substrate 131. A material is suitably silicon or glass.

The bonding of the substrates is performed by warming the substrates to a predetermined temperature within a bonding device, and then pressurizing the substrates for predetermined time at predetermined pressure. The bonding parameters are appropriately set according to adhesion materials. The bonding is suitably performed in a vacuum because the mixing of air bubbles into a bonding portion is suppressed.

When the adhesive 123 is a thermosetting type, the adhesive 123 may be warmed until being cured within a bonding device. A bonded substrate body may be taken out after the bonding, and then separately warmed in an oven or the like to promote curing. When the adhesive 123 is a UV delayed type, the adhesive 123 is irradiated with a specified amount of UV rays beforehand before bonding, and then bonding is performed. It is suitable to sufficiently promote the curing by further warming the bonded substrate body after bonding.

3. Process of Forming Gap

Figure 2F:
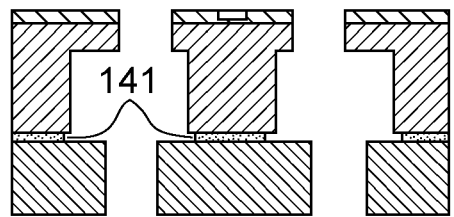
Figure 3D:
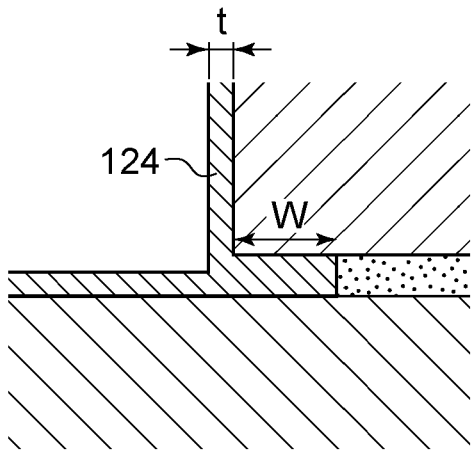
Figure 3B:
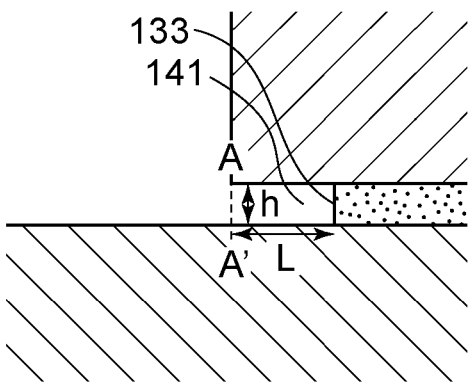

Next, as illustrated in FIG. 2F, the adhesive 123 is partially removed from the flow passage 115 side, and then an end portion of the adhesive 123 is retreated in a direction to the inside of the bonded substrate body 130 relative to the end surface of the bonding region, whereby a gap 141 is formed. FIG. 3B illustrates an enlarged view near the bonding surface after the adhesive removal process. In this process, the adhesive 123 protruding into the flow passage 115 beyond the end surface A-A' of the bonding region of the first substrate 131 and the second substrate 132 as illustrated in FIG. 3A is removed from the flow passage 115 side. At this time, the adhesive 123 is removed so that an end portion 133 of the adhesive 123 is located at a position retreated in the direction to the inside of the bonded substrate body 130 from the end surface A-A' of the bonding region. Thus, the gap 141 can be formed between the first substrate 131 and the second substrate 132. The gap 141 is space containing at least the bonding surface of the first substrate 131, the bonding surface of the second substrate 132, and the end portion 133 of the adhesive 123 and has an opening in the end surface A-A' of the bonding region.

Thus, by retreating the end portion 133 of the adhesive 123 to the inside relative to the end surface of the bonding region, the upper and lower sides of the adhesive 123 are stuck and bonded to the substrates, so that the deformation of the adhesive 123 is suppressed as compared with a case where the adhesive 123 protrudes from the end surface A-A' as illustrated in FIG. 3A. As a result, stress is hard to be generated and cracks and the like are hard to be generated in a film to be formed on the adhesive 123 described later.

Examples of techniques of removing the adhesive 123 and retreating the end portion 133 of the adhesive 123 include ashing or etching by oxygen plasma. In the removal by ashing, first, the bonded substrate body 130 is placed in an ashing chamber, and then oxygen ions or oxygen radicals are generated by high frequency plasma while passing oxygen gas. The oxygen ions and the oxygen radicals enter the flow passage from an opening portion of the first flow passage 112 and an opening portion of the third flow passage 114 of the bonded substrate body 130. In the flow passages, the oxygen ions and the oxygen radicals merely thinly oxidize the surface of substrate materials, such as silicon, but react with carbon as the main component of the adhesive 123 to volatilize the same, and therefore the adhesive 123 is isotropically removed.

As the removal by etching, wet etching is mentioned. In this case, the adhesive 123 is etched by dipping the bonded substrate body 130 in an etchant. As the etchant, liquid suitable for the adhesive type is selected. For example, examples of the etchant when the adhesive 123 contains an epoxy resin include concentrated sulfuric acid, chromic acid, and alkali permanganate. As the etchant when the adhesive 123 contains polyimide resin, an alkaline aqueous solution is suitable, and hydrazine, caustic alkali, and an organic amine compound are mentioned.

4. Process of Forming Film

Figure 2G:
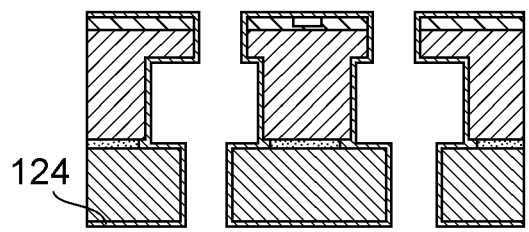
Figure 2G:
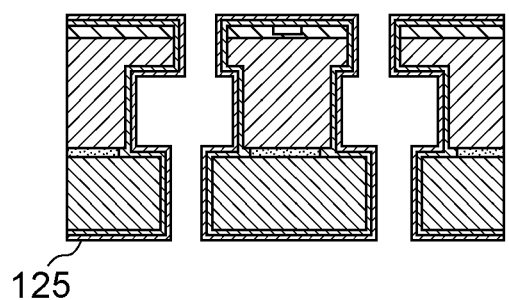
Figure 2H:
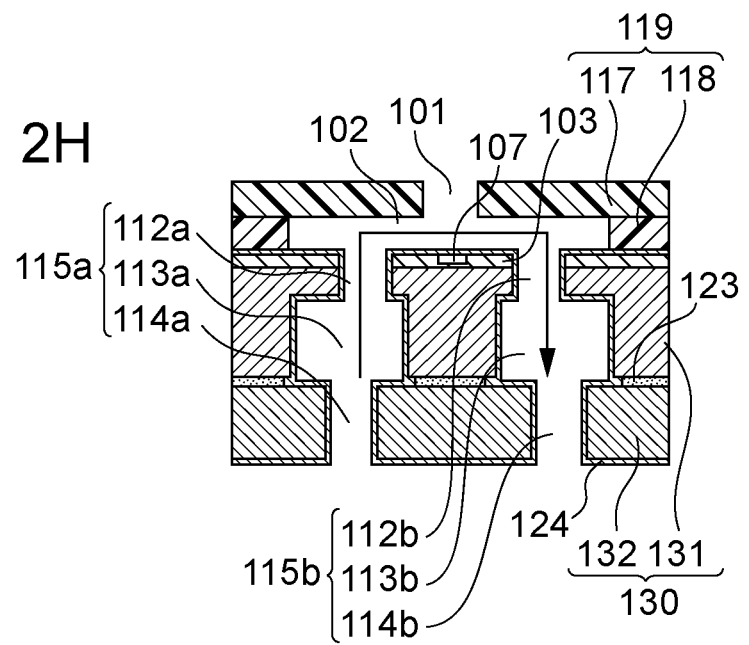

Next, as illustrated in FIG. 2G, the film 124 is formed on the inner wall surfaces of the flow passages over the first substrate 131, the second substrate 132, and the bonding region of the first substrate 131 and the second substrate 132. The film 124 is suitably formed so as to close the gap 141 or cross the gap 141. Forming the film 124 so as to close the gap 141 refers to a state where the film 124 is formed in the gap 141 and the gap 141 is filled with the film 124 as viewed from the flow passage side. On the other hand, forming the film 124 so as to cross the gap 141 refers to a state where the film 124 is not formed in the gap 141 and the film 124 is formed so as to cover the gap 141.

4-1. Case where Film is Formed so as to Close Gap

As illustrated in FIG. 2G, the film 124 is formed so as to close the gap 141. FIG. 3D illustrates the state where the gap 141 is closed with the film 124. Thus, the film 124 is in the state of being sandwiched between the bonding surface of the first substrate 131 and the bonding surface of the second substrate 132 and the adhesion strength to the substrates of the film 124 is high, and therefore peeling of the film 124 is hard to occur even when stress is generated in the film 124.

As a method for forming the film 124, an atomic layer deposition method is suitable. According to the atomic layer deposition method, a deposition process and an exhaustion process are alternately repeated. In the deposition process, precursor molecules or water molecules serving as the raw materials are sent into the substrate within a vacuum chamber, so that the target molecules of about one molecular layer are adsorbed to the substrate surface. At this time, functional groups in the precursors adsorb to the hydroxyl groups present on the substrate surface, and then the functional groups take hydrogen atoms from the hydroxyl groups to desorb as volatile molecules. Thereafter, the left oxygen atoms and inorganic elements in the precursors are bonded by a covalent bond. Then, in the exhaustion process, the molecules staying in the chamber without being adsorbed to the substrate surface in the deposition process are exhausted.

Figure 3E:
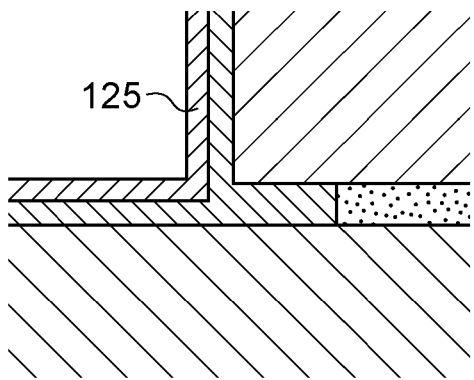
Figure 3C:
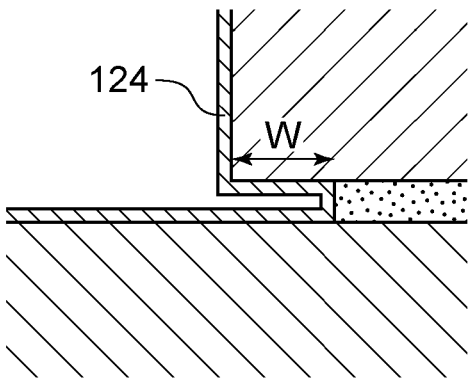

According to the atomic layer deposition method, a firm bond is formed by a covalent bond, and therefore a film with high adhesion strength can be formed. Moreover, according to the atomic layer deposition method, the mean free path of molecules is large, and therefore the throwing power of a film to a groove or a hole having a high aspect ratio is good. Therefore, the raw material forming the film enters a gap from the flow passage side, and a uniform film can be formed on the entire wall inside the gap. FIG. 3C illustrates a state during the formation of the film 124 in the gap 141 by the atomic layer deposition method. The film 124 adheres from the bonding surface of the first substrate 131 and the bonding surface of the second substrate 132 in the gap 141, and then the films 124 are united, whereby the gap 141 is closed. At this time, the films 124 almost fill the inside of the gap 141 to be united.

On the other hand, when a film is formed on the adhesive surface by the atomic layer deposition method, the adhesiveness between the film and the adhesive tends to be lower than the adhesiveness between the film and the substrate due to the method. This is because the number of the hydroxyl groups present on the surface of the adhesive is smaller than that on the substrate surface, and therefore the functional groups of the precursor molecules are difficult to react. Therefore, when a liquid resistant film is merely formed ranging from the surface of the bonded substrate body to the top of the adhesive as described in Japanese Patent Laid-Open No. 2014-124887, a film having a defect of having a large number of unreacted functional groups remaining on the interface with the adhesive is likely to be formed and the adhesion strength between the liquid resistant film and the adhesive is low, so that peeling of the liquid resistant film is likely to occur. When such a film is exposed to liquid, such as ink, for a long period of time, poor adhesion may be caused due to the fact that the adhesive deteriorates or the liquid enters the interface between the adhesive and the substrate.

However, according to this embodiment, since the film 124 is formed so as to close the gap 141 formed between the substrates by retreating the end portion 141 of the adhesive 123 as described above, the film 124 in the closed portion is firmly stuck to the substrates, and therefore peeling of the film 124 is hard to occur, even when the adhesion strength between the adhesive 123 and the film 124 is low.

As the film formation method, film formation techniques other than the atomic layer deposition method are usable insofar as the throwing power to a gap of a film is good. For example, CVD (Chemical Vapor deposition) methods, such as thermal CVD, plasma CVD, and Catalytic-CVD, are mentioned. Moreover, a sputtering method, a vacuum deposition method, an ion beam deposition method, and the like are also usable. In the film formation techniques, the throwing power of a film is poorer than that in the atomic layer deposition method but the film forming rate is high and a film having few impurities, such as carbon, hydrogen, and water, can be formed.

The film 124 has liquid resistance and is relatively stable even when exposed to liquid and has a function of protecting the adhesive and the substrate from liquid charged into the flow passage 115. The film 124 suitably contains simple substances, oxides, nitrides, or carbides of any element selected from the group consisting of Ta, Ti, Zr, Nb, V, Hf, and Si. Among the above, the film 124 suitably contains oxides of any element selected from the group consisting of Ta, Ti, Zr, Nb, V, Hf, and Si.

In order to close the gap 141 with the film 124, it is suitable to somewhat reduce the height h of the narrowest portion in the gap 141. For example, it is suitable to set the h to $1.0 \times 10^{-2}$ μm or more and $1.0 \times 10^{2}$ μm or less, particularly $1.0 \times 10^{-1}$ μm or more and $1.0 \times 10$ μm or less, and further 1.0 μm or more and $1.0 \times 10$ m or less. The height h of the gap 141 can be controlled by optimizing the parameters of a manufacturing process in the bonding process. Specifically, a desired height h can be set by appropriately controlling the adhesive material, the adhesive application thickness, the bonding pressure, the bonding temperature, and the pressurization time.

Moreover, when the thickness of the film 124 to be formed on the inner wall surface of the flow passage 115 is defined as t, it is suitable to satisfy the relationship h<2t. This is because it is assumed that the film 124 is usually formed with the same thickness on the bonding surface of the first substrate 131 and the bonding surface of the second substrate 132, and therefore, when a value which is twice as large as the thickness t is larger than the h value, the gap 141 can be closed. It is more suitable that the t and the h satisfy the relationship h≤t. On the other hand, t≤10h is suitable from the viewpoint of reducing the influence of film stress.

When the h is formed within the ranges mentioned above, it is suitable that the t is specifically $5.0 \times 10^{-3}$ µm or more and $1.0 \times 10^3$ µm or less, particularly $5.0 \times 10^{-2}$ µm or more and $1.0 \times 10^2$ µm or less, and further 1.0 µm or more and $1.0 \times 10$ µm or less.

In order to further increase the adhesion strength between the film 124 and the substrates in the gap 141, it is suitable to increase the region closed with the film 124 in the gap 141. To that end, a retreating width L of the end portion 133 of the adhesive 123 from the end surface A-A' of the bonding region illustrated in FIG. 3B may be increased and a width W of the region where the film 124 is in contact with the bonding surface of the first substrate 131 and the bonding surface of the second substrate 132 illustrated in FIG. 3D may be increased. Specifically, it is suitable that the retreating width L and the height h satisfy the relationship h<L. It is suitable that the retreating width L is specifically $2.0 \times 10^{-2}$ µm or more and $2.0 \times 10^2$ µm or less, particularly $2.0 \times 10^{-1}$ µm or more and $2.0 \times 10^2$ µm or less, and further 2.0 µm or more and $2.0 \times 10$ µm or less. In order to increase the retreating width L, it is suitable to reduce the protrusion width of the adhesive 123 occurring in bonding and to uniformize the protrusion width of the adhesive 123. As techniques of reducing and uniformizing the adhesive protrusion width, techniques of thinly applying the adhesive 123 and hardening the adhesive 123 are mentioned. A groove capable of escaping the adhesive 123 may be separately processed in any position in the bonding surface of the first substrate 131 or the second substrate 132.

Figure 4:
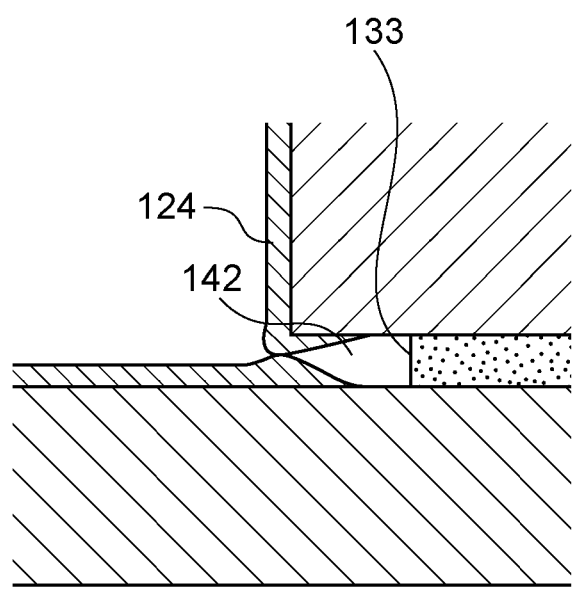
FIG. 4 is an enlarged cross-sectional view in a modification when forming a film so as to close a gap.

Here, in FIG. 3D, the gap 141 is entirely filled with the film 124 but it is not necessarily required. For example, as illustrated in FIG. 4, the gap 141 may be closed at an arbitrary position in the gap 141 so as to have space 142 between the end portion 133 of the adhesive 123 and a portion closed with the film 124. In this case, since the portion closed with the film 124 and the end portion 133 of the adhesive 123 are separated from each other, the generation of stress resulting from the adhesive 123 is suppressed, so that the adhesion reliability with the substrates of the film 124 is further improved. Moreover, even when the film 124 formed on the surface of the end portion 133 of the adhesive 123 is peeled, the flowing out of the adhesive 123 into the flow passage 115 is suppressed.

4-2. Case where Film is Formed so as to Cross Gap

Figure 5A:
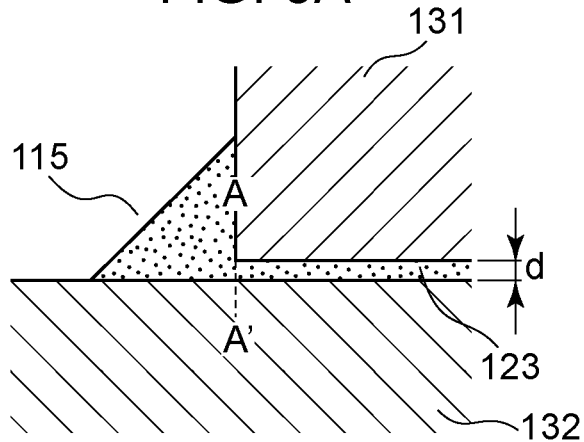
FIGS. 5A to 5C are enlarged cross-sectional views illustrating a case where a film is formed so as to cross a gap.
Figure 5B:
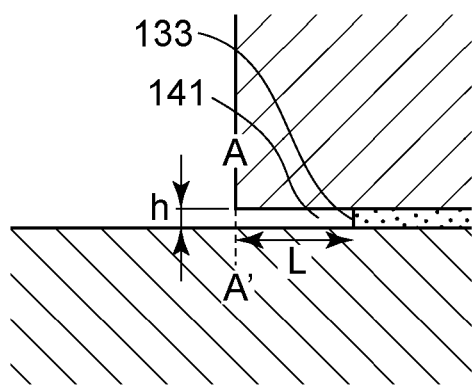
Figure 5C:
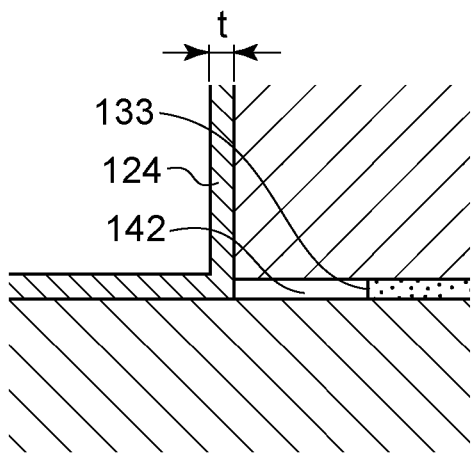

As illustrated in FIG. 5C, the film 124 is formed so as to cross the gap 141. In this case, the space 142 is present between the end portion 133 of the adhesive 123 and the portion closed with the film 124, and therefore, even when the adhesive 123 is deformed, the generation of stress in the film 124 is suppressed, so that the adhesion reliability of the film 124 is further improved.

A method for forming the film 124 so as to cross the gap 141 is described with reference to FIGS. 5A to 5C. FIG. 5A is a cross-sectional view near the bonding surface of the bonded substrate body 130 after bonding the first substrate 131 and the second substrate 132. As compared with FIG. 3A, the thickness d of the adhesive 123 is sharply reduced. Next, as illustrated in FIG. 5B, the adhesive 123 is removed from the flow passage 115 side and the end portion 133 of the adhesive 123 is retreated in a direction to the inside of the bonded substrate body 130 from the end surface A-A' of the bonding region. The retreating width is represented by L in the figure. By removing the adhesive 123, the gap 141 is formed between the end surface A-A' of the bonding region and the adhesive 123. Next, as illustrated in FIG. 5C, the inner wall of the flow passage 115 is covered with the film 124.

At this time, by appropriately selecting a formation method of the film 124, the aspect ratio L/h of the gap 141, and the height h of the gap 141, the film 124 can be formed so as to cross the gap 141. As a film formation method, a CVD method and a sputtering method having a high film forming rate are suitably used. In general, in the film formation methods, when the aspect ratio L/h is 20 or less, the film 124 can reach the inside. Therefore, the film 124 can be prevented from entering the gap 141 by setting the aspect ratio L/h of the gap 141 to a value larger than 20. Moreover, when the height h of the gap 141 is small, the film 124 formed near an opening portion of the gap 141 is formed so as to protrude into the gap 141 from the opening. In this case, as illustrated in FIG. 5C, the gap 141 can also be closed with the film 124. It is suitable that, when the thickness of the film 124 is defined as t, the height h of the gap 141 satisfies the relationship h<t and is specifically 0.3 µm or less.

In this embodiment, a liquid resistant film is used as the film 124 in both the case of forming the film 124 so as to close the gap 141 and the case of forming the film 124 so as to cross the gap 141. However, the present invention is not limited to this embodiment insofar as the film 124 is formed so as to close or cross the gap 141. For example, after the gap 141 is closed using the film 124 (first film 124) regardless of liquid resistance, and then the liquid resistant film described above may be formed as a second film 125 on the film 124 as illustrated in FIG. 2G' and FIG. 3E. The gap 141 may be closed by two layers of the first film 124 and the second film 125. In the cases, a manufacturing process increases because two layers of films are formed. However, a liquid resistant film is formed on the adhesive 123 through the first film 124, and therefore stress generated in the liquid resistant film can be sharply reduced. The first film 124 in this case suitably contains an inorganic element as the main component from the viewpoint of securing the adhesiveness with the second film 125 to be formed thereon. When the throwing power of the film 124 to the gap 141 is good, a wide range of inorganic materials are usable. For example, a simple substance or a compound of at least one element selected from the group consisting of Ru, Ni, Co, Pt, Mn, Al, Si, V, W, Nb, Ta, Hf, Zr, Ti, La, Y, Zn, Fe, Cu, Cr, and Mo is mentioned. The first film 124 suitably contains oxides of the inorganic elements, particularly an oxide of any element selected from the group consisting of Al, Si, and Ti. The first film 124 can be formed by the same technique as the film formation technique of the liquid resistant film and is suitably formed by the atomic layer deposition method as with the liquid resistant film.

After the film formation process is completed, an unnecessary portion of the film formed in the bonded substrate body 130 is removed. Examples of the unnecessary portion of the film include a portion formed an electrode pad present on the surface of the first substrate 131. As a technique of removing the unnecessary portion of the film, the following methods are mentioned, for example. First, a resist formed into a dry film is laminated on the front surface side of the bonded substrate body 130, and then an etching mask is formed in a portion other than the unnecessary portion of the film. Then, the unnecessary portion of the film is removed by dry etching or wet etching. After the etching, the etching mask is removed by a solvent or the like.

5. Process of Forming Discharge Port Formation Member

Next, as illustrated in FIG. 2H, a discharge port formation member 119 is formed on the bonded substrate body 130. First, a dry film resist in which a photocurable resin is applied onto a film base material is pasted onto the bonded substrate body 130. Thereafter, the dry film resist is exposed and developed, whereby the side wall 118 of the discharge port formation member 119 is patterned. Next, a top plate 117 of the discharge port formation member 119 is similarly patterned using a dry film resist. Finally, unexposed portions are developed, whereby the discharge port 101 and the pressure chamber 102 are formed, so that a liquid discharge head is completed.

Second Embodiment

A second embodiment of a liquid discharge head and a method for manufacturing the same is described with reference to the drawings. FIG. 6A to FIG. 6I are views explaining a method for manufacturing a liquid discharge head according to this embodiment step by step and all illustrate cross-sectional views of the liquid discharge head. In the description of this embodiment, the description is given focusing on points different from the first embodiment and a description of the points similar to the first embodiment is omitted.

1. Process of Preparing First Substrate and Second Substrate

Figure 6A:
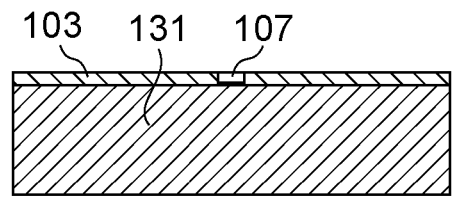
FIGS. 6A to 6I are cross-sectional views illustrating a manufacturing method of a second embodiment.
Figure 6B:
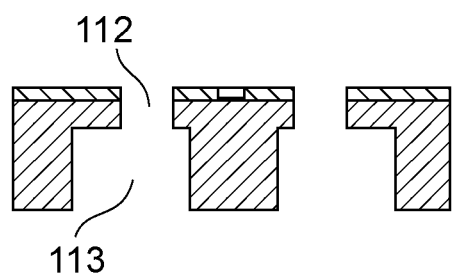

As illustrated in FIGS. 6A and 6B, the first substrate 131 is processed to form the flow passage 112 and the flow passage 113 in the same manner as in the first embodiment.

Figure 6C:
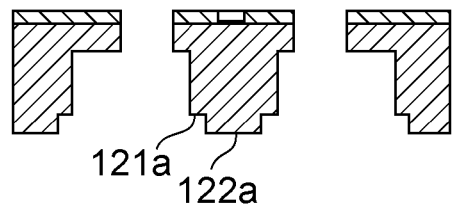

Next, as illustrated in FIG. 6C, the rear surface (bonding surface with second substrate 132) of the first substrate 131 is processed to form a first bonding surface 121a and a second bonding surface 122a. The first bonding surface 121a and the second bonding surface 122a are successively provided in a direction to the inside of the bonded substrate body from the end surface of the bonding region and a level difference is provided between the first bonding surface 121a and the second bonding surface 122a. A portion at the center of the bonded substrate body illustrated in FIG. 6C is in contact with two flow passages, and therefore the first bonding surface 121a is provided on each flow passage side on the bonding surface of the portion. Therefore, the bonding surface of a portion at the center has a convex shape in which the second bonding surface 122a is sandwiched between the two first bonding surfaces 121a. For processing the bonding surface into such a shape, the following methods are mentioned. First, an etching mask is formed to the bonding surface of the first substrate 131 in which the second flow passage 113 is formed. As a method for forming the etching mask to the bonding surface having a large opening portion as in the second flow passage 114, a method including laminating and transferring a resist processed into a dry film shape to the bonding surface is suitable. Before forming the second flow passage 113, an etching mask for processing the bonding surface may be formed beforehand on the bonding surface of the first substrate 131. As the etching mask, materials which have high heat stability and are stable to a processing process of the second flow passage 113 are suitable. Examples of such materials include an organic resin insoluble in resist and peeling liquid and inorganic films formed by a vapor deposition method, such as a silicon oxide film and a silicon nitriding film. Thereafter, the substrate is etched through the etching mask to form the first bonding surfaces 121a and the second bonding surface 122a. Thereafter, the etching mask is removed with peeling liquid or techniques, such as oxygen plasma ashing and dry etching. At this time, in order to remove an etching deposit adhering to the inner wall surface of the flow passage or the surface of the bonding surface, the bonded substrate body may be cleaned using a peeling liquid for etching deposit.

Figure 6D:
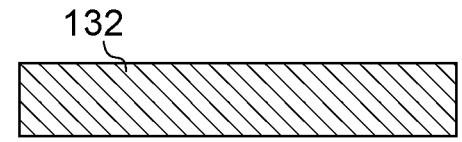

Next, the second substrate 132 is prepared as illustrated in FIG. 6D.

Figure 6E:
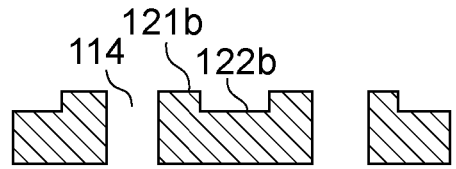

Thereafter, the third flow passage 114 is formed in the same manner as in the first embodiment as illustrated in FIG. 6E. Furthermore, the bonding surface of the second substrate 132 is processed to separately form a first bonding surface 121b and a second bonding surface 122b which can be engaged with the level difference (convex shape) of the bonding surface of the first substrate 131. The first bonding surface 121b and the second bonding surface 122b are successively provided in the direction to the inside of the bonded substrate body from the end surface of the bonding region as with the bonding surface of the first substrate 131 and a level difference is provided between the first bonding surface 121b and the second bonding surface 122b. The first substrate 131 and the second substrate 132 are engaged with each other with the level differences.

In this embodiment, the convex portion is formed in the bonding surface of the first substrate 131 and the concave portion is formed in the bonding surface of the second substrate 132 but the concave portion may be formed in the first substrate 131 and the convex portion may be formed in the second substrate 132 side.

2. Process of Bonding First Substrate and Second Substrate

Figure 6F:
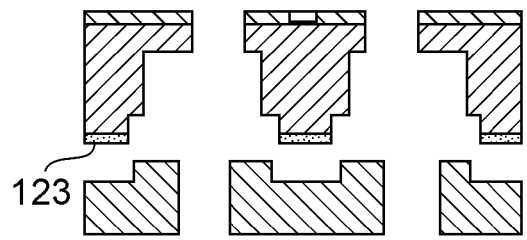

Next, the adhesive 123 is applied to the second bonding surface 122a of the first substrate 131 as illustrated in FIG. 6F. Then, the first substrate 131 to which the adhesive 123 is applied and the second substrate 132 are aligned with an alignment device, and then the two substrates are pinched with a clamping mechanism or the like to be temporarily fixed. Then, the temporarily fixed substrates are moved to a bonding device.

Figure 6G:
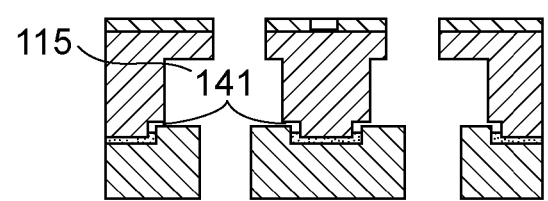

Next, as illustrated in FIG. 6G, the substrates are warmed to a predetermined temperature within the bonding device, and then pressurized for predetermined time at predetermined pressure, whereby the first substrate 131 and the second substrate 132 are bonded. At that time, the first flow passage 112, the second flow passage 113, and the third flow passage 114 communicate with each other to configure the flow passage 115. In this embodiment, by not applying the adhesive 123 to the first bonding surfaces 121a of the first substrate 131, the gap 141 can be formed in the first bonding surface simultaneously with the bonding of the first substrate 131 and the second substrate 132. The first substrate 131 and the second substrate 132 are bonded through the adhesive 123 applied to the second bonding surface 122a of the first substrate 131.

Figure 7A:
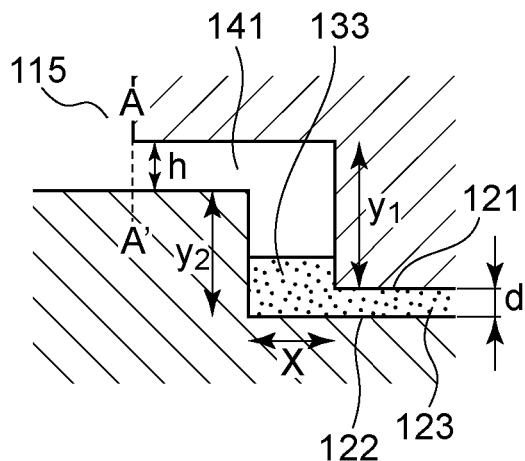
FIGS. 7A to 7C' are enlarged cross-sectional views in the manufacturing method of the first embodiment.

FIG. 7A illustrates a state where the vicinity of the bonding surface when the bonding is completed is enlarged. In FIG. 7A, h represents the height of the gap 141, $y_1$ represents the height of the level difference provided in the bonding surface of the first substrate 131, $y_2$ represents the level difference provided in the bonding surface of the second substrate 132, and d represents the thickness of the adhesive 123. In order to form the gap 141 simultaneously with the bonding of the substrates, the parameters may be optimized. Specifically, the level difference shape of each substrate and the adhesive thickness d after the bonding are controlled so as to satisfy $y_1+d>y_2$.

Moreover, since the adhesive 123 is pressurized in the bonding, the end portion 133 of the adhesive 123 usually flows to the flow passage 115 side as compared with that before the bonding. Therefore, in order to form the gap 141 so as not to cause the end portion 133 of the adhesive 123 to protrude into the flow passage 115 in the bonding, it is suitable to reduce the flow amount of the adhesive 123. The flow amount of the adhesive 123 can be reduced by appropriately controlling the adhesive material, the adhesive application thickness, the bonding pressure, the bonding temperature, and the pressurization time. Moreover, also by increasing the width x in the horizontal direction of the gap 141 between the bonding surfaces and increasing $y_1$ and $y_2$ illustrated in FIG. 7A, the flow amount of the adhesive 123 can be reduced.

Thus, the gap 141 can be formed in the first bonding surfaces 121a simultaneously with the bonding of the substrates by not applying the adhesive 123 to at least a portion where the gap 141 is to be formed of the bonding region where the first bonding surface 121a of the first substrate 131 and the bonding surface of the second substrate 132 face each other. Therefore, there is a necessity of processing the substrates into a concave/convex shape as compared with the first embodiment but there is a merit of eliminating the necessity of providing the process of removing the adhesive 123. Moreover, in this embodiment, the retreating width of the adhesive 123 becomes equal to the width of the first bonding surface when the thickness of the adhesive 123 and the convex/concave shape of the bonding surface are appropriately controlled, and therefore the retreating width of the adhesive 123 is more easily controlled as compared with the first embodiment. Moreover, the substrates are bonded with the level differences of the bonding surfaces, and therefore, even when it is difficult to reduce the thickness of the adhesive 123, the height h of the gap 141 can be relatively easily narrowed by controlling the level difference shape of each substrate. Therefore, a film is easily formed so as to close or cross the gap 141 in a film formation process described later.

Also in this embodiment, an end portion of the adhesive 123 is located at a position retreated inside relative to the end surface of the bonding region, and therefore the adhesive 123 is in a state of being stuck to the substrates to be bonded in the bonding region. Therefore, the deformation of the adhesive 123 is suppressed as compared with the case where the adhesive 123 protrudes from the end surface A-A' as illustrated in FIG. 3A. As a result, stress is hard to be generated and cracks and the like are hard to be generated in a film to be formed on the adhesive 123 described later.

Also in the case where the substrates are bonded with the level differences of the bonding surfaces as in this embodiment, the gap 141 may be formed by partially removing the adhesive 123 from the flow passage side as with the first embodiment.

3. Process of Forming Film

Figure 6H:
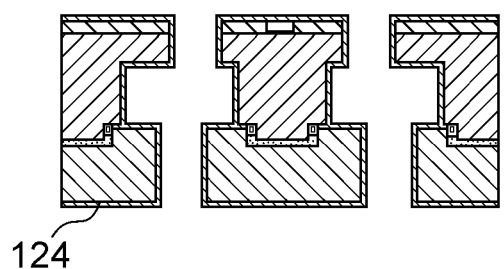
Figure 6H:
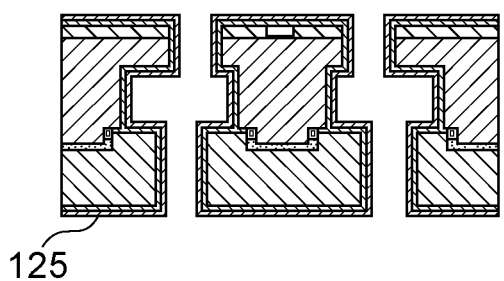

Next, as illustrated in FIG. 6H, the film 124 is formed on the inner wall surface over the first substrate 131, the second substrate 132, and the bonding region of the first substrate 131 and the second substrate 132. The film 124 is formed so as to close the gap 141 or cross the gap 141. The film 124 can be formed by the same technique as that of the first embodiment.

Figure 7B:
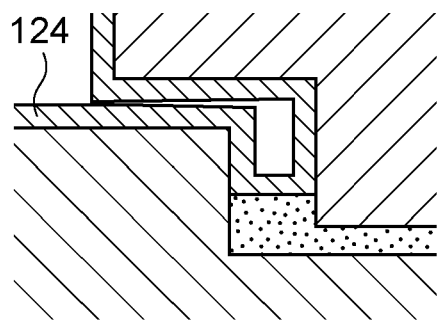
Figure 7C:
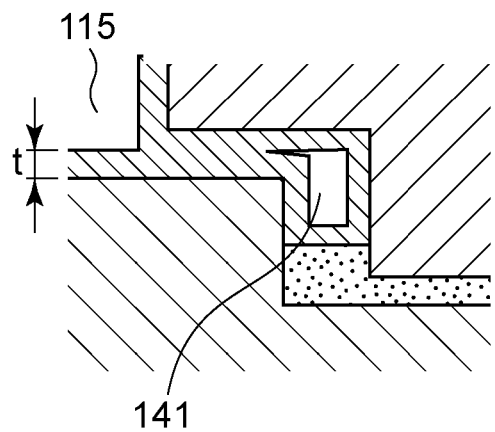
Figure 7C:
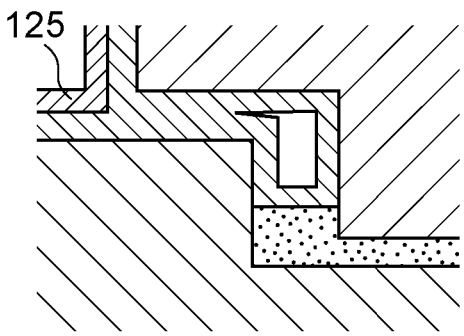

FIGS. 7B and 7C illustrate a state where the film 124 is formed in the gap 141 in the case of forming the film 124 so as to close the gap 141. As illustrated in the figures, the film 124 adheres from the bonding surface of the first substrate 131 and the bonding surface of the second substrate 132 in the gap 141, and then the films 124 are united after a while to close the gap 141. The gap 141 is closed with the film 124 on the first bonding surface side and a portion which remains without being closed is present in the gap 141 formed in the horizontal direction between the bonding surfaces. Thus, the film 124 is hardly affected by the adhesive 123 due to having space between the end portion 133 of the adhesive 123 and the closed portion.

When forming the two layers of films as described in the first embodiment, the second film 125 is formed on the first film 124 as illustrated in FIG. 6H' and FIG. 7C'.

4. Process of Forming Discharge Port Formation Member

Figure 6I:
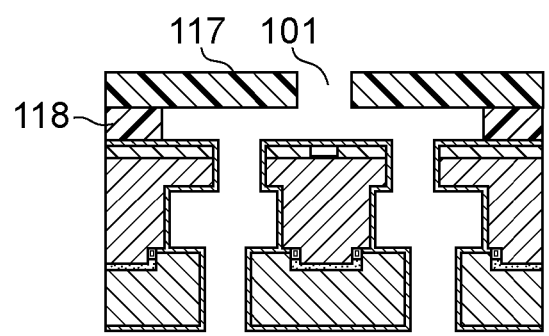

Next, as illustrated in FIG. 6I, the discharge port formation member 119 is formed on the bonded substrate body 130 as with the first embodiment, so that a liquid discharge head is completed.

Other Embodiments

Although the bonded substrate body of the embodiment described above has the configuration in which the level difference is generated between the inner wall surface of the flow passage on the first substrate 131 side and the inner wall surface of the flow passage on the second substrate 132 side, the bonded substrate body may have a configuration of not having a level difference in the inner wall surfaces. Moreover, although the flow passage is formed in both the first substrate 131 and the second substrate 132 in the bonded substrate bodies of the embodiments described above, a bonded substrate body may be acceptable which takes a configuration in which a flow passage is formed in one substrate and the other substrate covers the flow passage. Moreover, although the embodiments described above have the configuration of having a film on the inner wall surface of the through-hole penetrating the upper and lower sides of the bonded substrate body, the prevent disclosure is applicable to a bonded substrate body having a non-through-hole insofar as the non-through-hole is formed so as to cross a first substrate and a second substrate. Moreover, the present disclosure is applicable to a bonded substrate body not having a through-hole or a non-through-hole insofar as the bonded substrate body has a configuration in which a first substrate and a second substrate are bonded in the vertical direction and a film is formed on the side surface thereof.

Moreover, although the bonded substrate body is used as a member having an energy generating element and forming a flow passage in the liquid discharge head described in the embodiment described above, the present invention is not limited thereto and the bonded substrate body is usable for a member at an arbitrary position in the liquid discharge head. For example, when the discharge port formation member is formed by bonding two or more substrates, the bonded substrate body is usable as the discharge port formation member. The case where the discharge port formation member 119 is formed by bonding two or more substrates refers to a case where the discharge port formation member contains the top plate 117 forming the discharge port 101 and the side wall 118 forming the pressure chamber 102 as illustrated in FIG. 2H, for example. Moreover, the bonded substrate body is applicable also to a bonded body of at least one substrate configuring a discharge port formation member and a substrate having an energy generating element.

Moreover, the bonded substrate body is also applicable to the first substrate 131 provided with the first flow passage 112 and the second flow passage 113 in the embodiment described above. More specifically, a bonded substrate body may be acceptable which is formed by dividing the first substrate 131 into a substrate having the first flow passage 112 and a substrate having the second flow passage 113, and then bonding the substrates. More specifically, a configuration can be taken in which one substrate has a flow passage of one width, and two or more of the substrates are overlapped.

A method for manufacturing a bonded substrate body in such a case is described with reference to FIGS. 8A to 8I.

Figure 8A:
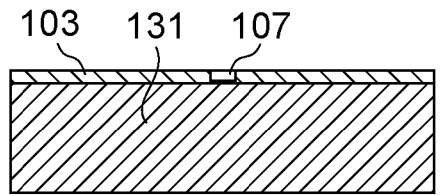
FIGS. 8A to 8I are cross-sectional views illustrating a manufacturing method of another embodiment.
Figure 8B:
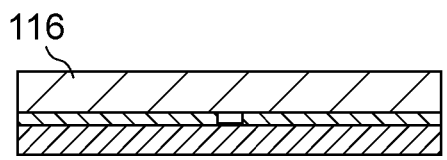

First, a support member 116 is pasted to the surface of the first substrate 131 (FIG. 8A) similar to that of the embodiments described above, and then the first substrate 131 is thinned from the rear surface side (FIG. 8B). As a support member, a UV curable tape or a thermal peeling tape is mentioned and the tapes can be pasted to the surface of the first substrate 131 using a laminator. A glass substrate or a silicon substrate may be thermally bonded through an adhesive which can be peeled from the substrate later. As a thinning technique, grinding, polishing, dry etching, and wet etching are mentioned.

Figure 8C:

Next, the second substrate 132 is prepared in the same manner as in the embodiments described above. Then, the adhesive 123 is applied to the front surface side of the second substrate 132 as illustrated in FIG. 8C. As a coating method of the adhesive 123, spin coating or slit coating is mentioned. Herein, as the adhesive 123, the same substances as those of the embodiments described above are usable. In order to reduce poor bonding, the bonding surface of the first substrate 131 and the second substrate 132 may be polished before applying the adhesive 123 to improve the flatness of the bonding surface. The adhesive 123 may be applied to the rear surface of the first substrate 131.

Figure 8D:
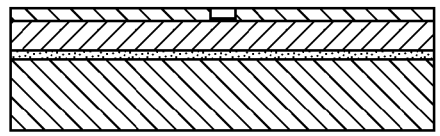

Next, as illustrated in FIG. 8D, the first substrate 131 and the second substrate 132 are bonded, and then the support member 116 is removed. When the support member 116 does not resist to the heat curing process of the adhesive 123, the substrates are temporarily bonded at a low temperature, the support member 116 is removed from a bonded substrate body, and thereafter high-temperature heat treatment for promoting the curing of the adhesive 123 is carried out. Before the high-temperature heat treatment after removing the support member 116, a residue of the adhesive 123 of the support member 116 may be removed. Moreover, the curing of the adhesive 123 may be promoted by placing the substrates in a bonding device again to sufficiently spread the adhesive 123 to the substrates without performing the high-temperature heat treatment.

Figure 8E:
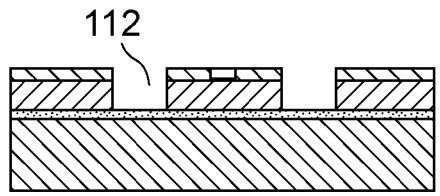
Figure 8F:
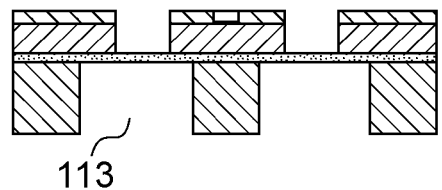

Next, as illustrated in FIG. 8E, the first flow passage 112 is formed by performing etching from the first substrate 131 side of the bonded substrate body. At this time, an adhesive layer serves as a stopper of the etching and can stop the etching of the flow passage. Thereafter, as illustrated in FIG. 8F, the second flow passage 113 is formed by performing etching from the second substrate 132 side. The etching of the second flow passage 113 can also be stopped by the adhesive layer. For the etching, the same etching techniques as those in the formation of the flow passages in the embodiments described above are usable. After the formation of each flow passage is completed, the resultant substance may be cleaned with a peeling liquid or the like to remove a deposit adhering to the inner wall surface of the flow passage. Thereafter, the adhesive layer is removed by etching. As an etching technique of the adhesive layer, the techniques when removing the adhesive described in the embodiments described above are usable.

Figure 8G:
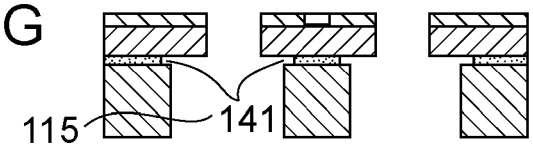
Figure 8H:
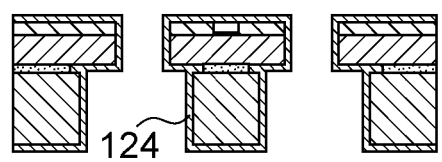

At this time, the adhesive layer remaining on a bottom portion of the second flow passage 113 is completely removed and the adhesive layer sandwiched between the first substrate 131 and the second substrate 132 is partially removed (FIG. 8G). More specifically, the end portion of the adhesive 123 is retreated in a direction to the inside of the bonded substrate body from the end surface of the bonding region. After the removal of the adhesive 123 is completed, the adhesive 123 present between the first substrate 131 and the second substrate 132 is partially removed, so that the gap 141 is formed. On and after the process, a film is formed, and a discharge port formation member is formed, so that a liquid discharge head is completed in the same manner as in the embodiments described above.

EXAMPLES

Example 1

As a first substrate, an 8 inch silicon substrate (thickness: 730 μm) on the front surface (mirror surface) of which an aluminum wiring line, an interlayer insulation film of silicon oxide thin film, a heater thin film pattern of tantalum nitride, and a contact pad electrically connecting to an external control unit were formed was prepared (FIG. 2A). A 180 μm thick UV curing tape was pasted as a protective tape to the surface of the first substrate, and then the rear surface of the first substrate was thinned with a grinding device until the substrate thickness reached 500 μm. Thereafter, in order to smoothen the ground surface, the surface was polished with a CMP device. The polishing was performed using a slurry containing colloidal silica as the main component and a polyurethane-based polishing pad. Thereafter, the polished surface was cleaned using a cleaning liquid containing a mixed liquid of 8% by weight of ammonia, 8% by weight of hydrogen peroxide solution, and 84% by weight of pure water to remove the slurry.

Next, a mask for forming a second flow passage was formed. First, a polyamide resin (manufactured by Hitachi Chemical Co., Ltd., Trade Name: HIMAL) was applied to the entire rear surface of the substrate with a thickness of 2 μm by a spin coating method, and then cured by heat treatment at 250° C. for 1 H. Then, a novolak-based resist was applied thereonto, exposed with a double-sided aligner, and then developed by a development device to pattern the resist. Dry etching was carried out using plasma generated by discharging $O_2$ gas and $CF_4$ gas through the resist to process the same into a desired mask shape. After the etching, the resist was removed, so that the mask was completed.

Next, a groove serving as the second flow passage was formed by etching (FIG. 2B). For the etching, a Bosch process of repeating etching by $SF_6$ gas and deposition by $CF_4$ gas was used. The etching was stopped when the average groove depth reached 300 μm. The protective tape was irradiated with UV rays to be removed, and then the resist or the etching deposit was removed with a peeling liquid containing hydroxylamine as the main component.

Next, a protective tape was pasted to the rear surface of the first substrate, a resist mask was formed on the front surface by the same method as that described above, and then a first flow passage containing a plurality of holes was formed by dry etching from the front surface side of the substrate. After the etching, the protective tape was removed, and then the resist or a deposit was removed by a peeling liquid.

Next, a 500 μm thick silicon substrate was prepared as a second substrate (FIG. 2C). A protective film was pasted to the front surface (mirror surface) of the second substrate, a resist mask was formed on the rear surface, and then a third flow passage was formed according to the Bosch process (FIG. 2D). Thereafter, the protective film was peeled, and then the resist and a deposit were removed by a peeling liquid.

Next, an adhesive was applied to the rear surface of the first substrate. First, an 8 inch silicon substrate was separately prepared, and then a benzocyclobutene solution was spin-coated thereonto with a thickness of 1 µm as an adhesive. Thereafter, the bonding surface of the first substrate was brought into contact with the applied adhesive, whereby the adhesive was transferred to the rear surface of the first substrate.

Next, the first substrate and the second substrate were aligned using a bonding alignment device, and then two places of end portions of the substrates were pressurized with a clamp jig to be temporarily fixed (FIG. 2E). The temporarily fixed substrates were moved into a bonding device, pressurized and bonded for 5 minutes increasing the temperature to 150° C. in a vacuum, cooled, and then taken out from the bonding device. Thereafter, heat treatment was carried out at 250° C. for 1 hour in an oven in a nitrogen atmosphere to cure the adhesive.

Next, the adhesive was removed from the flow passage side by isotropic etching using 02 plasma and $CF_4$ plasma, and then a gap was formed by locating an end portion of the adhesive at a position 5 µm retreated from the end surface of the bonding region (FIG. 2F).

Next, a film was formed on the inner wall surface of the flow passage of the bonded substrate body by an atomic layer deposition film forming device. As a first film, an $Al_2O_3$ film was formed with a thickness of 0.3 µm so as to close the gap (FIG. 2G, FIG. 3D). Furthermore, a TiO film was formed with a thickness of 0.2 µm as a second film on the first film (FIG. 2G', FIG. 3E). Thereafter, a dry film resist containing a positive resist was laminated on the front surface of the first substrate of the bonded substrate body to form an etching mask. By dry etching using plasma containing mixed gas of $CF_4$, $O_2$, and Ar, the film on the contact pad was removed.

Next, a negative dry film containing an epoxy resin was pasted onto the front surface of the first substrate, and then exposed to form the wall of a discharge port formation member. Furthermore, a dry film was pasted from above, and then exposed to form the top plate of the discharge port formation member. Then, unexposed portions were removed by development to form a discharge port and a pressure chamber (FIG. 2H). Thereafter, the discharge port formation member was cured by performing heat treatment in an oven under the conditions of 200° C. and 1 hour.

Thus, a liquid discharge head was produced. When the inner wall surface of the flow passage of the liquid discharge head was observed under an optical microscope and an electron beam microscope by cutting the head to expose the inner wall surface of the flow passage, no cracks were observed on the surface.

Example 2

As a first substrate, an 8 inch silicon substrate (thickness: 730 µm) on the front surface (mirror surface) of which an aluminum wiring line, an interlayer insulation film of silicon oxide thin film, a heater thin film pattern of tantalum nitride, and a contact pad electrically connecting to an external control unit were formed was prepared (FIG. 6A). A 180 µm thick UV curing tape was pasted as a protective tape to the front surface of the first substrate, and then the rear surface of the first substrate was thinned with a grinding device until the substrate thickness reached 500 µm. Thereafter, in order to smoothen the ground surface, the surface was polished with a CMP device. The polishing was performed using a slurry containing colloidal silica as the main component and a polyurethane-based polishing pad. Thereafter, the polished surface was cleaned using a cleaning liquid containing a mixed liquid of 8% by weight of ammonia, 8% by weight of hydrogen peroxide solution, and 84% by weight of pure water to remove the slurry.

Next, a mask for forming a first bonding surface and a second bonding surface was formed on the rear surface of the first substrate. The mask is a mask for forming a level difference of a convex shape described in the second embodiment. First, a polyamide resin (manufactured by Hitachi Chemical Co., Ltd., Trade Name: HIMAL) was applied to the entire rear surface of the substrate with a thickness of 2 µm by a spin coating method, and then cured by heat treatment at 250° C. for 1 H. Then, a novolak-based resist was applied thereonto, exposed with a double-sided aligner, and then developed by a development device to pattern a resist. Dry etching was carried out using plasma generated by discharging $O_2$ gas and $CF_4$ gas through the resist to process the same into a desired mask shape. After the etching, the resist was removed, so that the mask was completed.

Next, a resist mask for forming a second flow passage was formed on the rear surface side of the first substrate by the same method as that described above. Thereafter, a groove serving as the second flow passage was formed by etching (FIG. 6B). For the etching, a Bosch process of repeating etching by $SF_6$ gas and deposition by $CF_4$ gas was used. The etching was stopped when the average groove depth reached 300 µm. The protective tape was irradiated with UV rays to be removed, and then the resist or the etching deposit was removed with a peeling liquid containing hydroxylamine as the main component.

Next, a protective tape was pasted to the rear surface of the first substrate, a resist mask was formed on the front surface by the same method as that described above, and then a first flow passage containing a plurality of holes was formed by dry etching from the front surface side of the substrate (FIG. 6B). After the etching, the protective tape was removed, and then the resist or a deposit was removed by a peeling liquid.

Next, a protective tape was laminated on the front surface side of the first substrate, and then etching was performed by silicon anisotropic etching using $SF_6$ plasma through a convex portion forming mask formed on the rear surface side until the depth reached 20 µm to form a convex portion in the bonding surface (FIG. 6C). Then, the convex portion forming mask was removed by ashing using oxygen plasma.

Next, a 500 µm thick silicon substrate was prepared as a second substrate 132 (FIG. 6D). A resist mask was formed on the front surface (mirror surface) of the second substrate, and then a concave-shaped level difference having a depth of 20 µm was formed by silicon anisotropic etching using $SF_6$ plasma (FIG. 6E). Thereafter, a protective film was pasted to the front surface of the second substrate, a resist mask was formed on the rear surface, and then a third flow passage was formed according to the Bosch process. Thereafter, the protective film was peeled, and then the resist and a deposit were removed by a peeling liquid.

Next, an adhesive was applied to the rear surface of the first substrate (FIG. 6F). First, an 8 inch silicon substrate was separately prepared, and then a benzocyclobutene solution was spin-coated thereonto with a thickness of 1 µm as an adhesive. Thereafter, the bonding surface of the first substrate was brought into contact with the applied the adhesive, whereby the adhesive was transferred to the rear surface of the first substrate.

Next, the first substrate and the second substrate were aligned using a bonding alignment device, and then two places of end portions of the substrates were pressurized with a clamp jig to be temporarily fixed (FIG. 6G). The temporarily fixed substrates were moved into a bonding device, pressurized and bonded for 5 minutes increasing the temperature to 150° C. in a vacuum, cooled, and then taken out from the bonding device. Thereafter, heat treatment was carried out at 250° C. for 1 hour in an oven in a nitrogen atmosphere to cure the adhesive.

Next, a film was formed on the inner wall surface of the flow passage of the bonded substrate body by an atomic layer deposition film forming device. As a first film, an $Al_2O_3$ film was formed with a thickness of 0.3 μm so as to close the gap (FIG. 6H, FIG. 7C). Furthermore, a TiO film was formed with a thickness of 0.2 μm as a second film on the first film (FIG. 6H', FIG. 7C').

Thereafter, a dry film resist containing a positive resist was laminated on the front surface of the first substrate of the bonded substrate body to form an etching mask. By dry etching using plasma containing mixed gas of $CF_4$, $O_2$, and Ar, the film on the contact pad was removed.

Next, a negative dry film containing an epoxy resin was pasted onto the front surface of the first substrate, and then exposed to form the wall of a discharge port formation member. Furthermore, a dry film was pasted from above, and then exposed to form the top plate of the discharge port formation member. Then, unexposed portions were removed by development to form a discharge port and a pressure chamber (FIG. 6I). Thereafter, the discharge port formation member was cured by performing heat treatment in an oven under the conditions of 200° C. and 1 hour.

Thus, a liquid discharge head in which a good film was formed on the inner wall surface of the flow passages was produced.

Example 3

In the same manner as in Example 1, a first substrate (730 μm thick silicon substrate) was prepared (FIG. 8A), and then thinned from the rear surface side (FIG. 8B). Example 3 is different from Example 1 in that the reduced thickness is 150 μm. Furthermore, a 500 μm thick silicon substrate was prepared as a second substrate, and then a benzocyclobutene solution was applied as an adhesive to the front surface of the second substrate by a spin coating method (FIG. 8C). The application thickness was set to 0.5 μm. Next, the first substrate and the second substrate were aligned and temporarily fixed (FIG. 8D). The temporarily fixed substrates were moved into a bonding device, pressurized and bonded for 5 minutes increasing the temperature to 150° C. in a vacuum, cooled, and then taken out from the bonding device. Thereafter, heating was separately performed in an oven in a nitrogen atmosphere under the conditions of 250° C. and 1 hour to produce a bonded substrate body.

In the bonded substrate body, a first flow passage was formed from the first substrate side using a dry etching by the Bosch process, and then the etching was stopped with an adhesive layer (FIG. 8E). Subsequently, a second flow passage was similarly formed from the second substrate side, and then the etching was stopped with the adhesive layer (FIG. 8F). Next, the adhesive exposed into the flow passages was removed by anisotropic etching using $O_2$ plasma and $CF_4$ plasma, and further an end portion of the adhesive was retreated to a position 5 μm from an end surface of a bonding region to form the gap (FIG. 8G).

Next, the gap was closed by forming a 0.5 μm thick $Al_2O_3$ film as a first film and a 0.2 μm thick TiO film as a second film by an atomic layer deposition film forming device (FIG. 8H), and then a liquid resistant film was formed on the ink flow passage wall surface. Thereafter, a film on a contact pad was removed by dry etching.

Figure 8I:
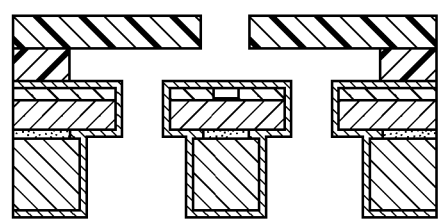

Thereafter, a discharge port formation member was formed in the same manner as in Example 1 (FIG. 8I). Thus, a liquid discharge head in which a good film was formed on the inner wall surface of the flow passage was produced.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-069287 filed Mar. 30, 2017, which is hereby incorporated by reference herein in its entirety.

What is claimed is:

1. A method for manufacturing a bonded substrate body in which a first substrate and a second substrate are bonded through an adhesive and which has a film formed on the bonded substrate body over the first substrate, the second substrate, and a bonding region of the first substrate and the second substrate, the method comprising:
    forming the film to the bonding region in which an end portion of the adhesive is located at a position retreated in a direction to an inside of the bonded substrate body from an end surface of the bonding region,
    removing at least one part of the adhesive after bonding the first substrate and the second substrate, and then
    retreating the end portion of the adhesive in the direction to the inside of the bonded substrate body relative to the end surface of the bonding region.

2. The method for manufacturing a bonded substrate body according to claim 1, wherein
    the film is formed so as to close a gap between the first substrate and the second substrate.

3. The method for manufacturing a bonded substrate body according to claim 2, wherein
    a space is formed between a portion closing the gap of the film and the end portion of the adhesive.

4. The method for manufacturing a bonded substrate body according to claim 1, wherein
    the film is formed so as to cross a gap between the first substrate and the second substrate.

5. The method for manufacturing a bonded substrate body according to claim 1, wherein
    the first substrate and the second substrate each successively have a first bonding surface and a second bonding surface in a direction to the inside of the bonded substrate body from a side of the end surface of the bonding region,
    a level difference is provided between the first bonding surface and the second bonding surface, and
    the first substrate and the second substrate are engaged with each other with the level differences.

6. The method for manufacturing a bonded substrate body according to claim 5, wherein
    the gap is formed simultaneously with the bonding of the first substrate and the second substrate by not applying the adhesive to at least one part of the bonding region where the first bonding surface of the first substrate and the first bonding surface of the second substrate face each other.

7. The method for manufacturing a bonded substrate body according to claim 1, wherein
when a height between a bonding surface of the first substrate and a bonding surface of the second substrate is defined as h and a thickness of the film formed on the bonded substrate body is defined as t in the gap between the first substrate and the second substrate, the film is formed so as to satisfy a relationship h<2t.

8. The method for manufacturing a bonded substrate body according to claim 1, wherein
a retreating width L from the end surface of the bonding region of the end portion of the adhesive is $2.0 \times 10^{-2}$ μm or more and $2.0 \times 10^2$ μm or less.

9. The method for manufacturing a bonded substrate body according to claim 1, wherein
the film is formed by an atomic layer deposition method.

10. The method for manufacturing a bonded substrate body according to claim 1, wherein
the film contains an oxide of at least one element selected from the group consisting of Ru, Ni, Co, Pt, Mn, Al, Si, V, W, Nb, Ta, Hf, Zr, Ti, La, Y, Zn, Fe, Cu, Cr, and Mo.

11. The method for manufacturing a bonded substrate body according to claim 10, wherein
the film contains an oxide of any element selected from the group consisting of Ta, Ti, Zr, Nb, V, Hf, and Si.

12. The method for manufacturing a bonded substrate body according to claim 1 comprising:
defining the film as a first film, further forming a second film on the first film by an atomic layer deposition method.

13. The method for manufacturing a bonded substrate body according to claim 12, wherein
the second film contains an oxide of any element selected from the group consisting of Ta, Ti, Zr, Nb, V, Hf, and Si.

14. A method for manufacturing a bonded substrate body in which a first substrate and a second substrate are bonded through an adhesive and which has a film formed on the bonded substrate body over the first substrate, the second substrate, and a bonding region of the first substrate and the second substrate, the method comprising:
forming the film to the bonding region in which an end portion of the adhesive is located at a position retreated in a direction to an inside of the bonded substrate body from an end surface of the bonding region,
wherein a retreating width L from the end surface of the bonding region of the end portion of the adhesive is $2.0 \times 10^{-2}$ μm or more and $2.0 \times 10^2$ μm or less.

15. The method for manufacturing a bonded substrate body according to claim 14, wherein
the film is formed so as to close a gap between the first substrate and the second substrate.

16. The method for manufacturing a bonded substrate body according to claim 15, wherein
a space is formed between a portion closing the gap of the film and the end portion of the adhesive.

17. The method for manufacturing a bonded substrate body according to claim 14, wherein
the film is formed so as to cross a gap between the first substrate and the second substrate.

18. The method for manufacturing a bonded substrate body according to claim 14, wherein
when a height between a bonding surface of the first substrate and a bonding surface of the second substrate is defined as h and a thickness of the film formed on the bonded substrate body is defined as t in the gap between the first substrate and the second substrate, the film is formed so as to satisfy a relationship h<2t.

19. The method for manufacturing a bonded substrate body according to claim 14, wherein
the film is formed by an atomic layer deposition method.

20. The method for manufacturing a bonded substrate body according to claim 14, wherein
the film contains an oxide of at least one element selected from the group consisting of Ru, Ni, Co, Pt, Mn, Al, Si, V, W, Nb, Ta, Hf, Zr, Ti, La, Y, Zn, Fe, Cu, Cr, and Mo.

* * * * *